United States Patent [19]

Broussoux et al.

[11] Patent Number: 4,521,322
[45] Date of Patent: Jun. 4, 1985

[54] PROCESS FOR MANUFACTURING A PIEZO- OR PYROELECTRIC POLYMER MATERIAL COMPRISING A CROSS-LINKING STEP

[75] Inventors: Dominique Broussoux, Marcoussis; Hugues Facoetti, Fontenay-Sous-Bois; Francois Micheron, Gif-sur-Yvette; Lucien Monnerie, Paris, all of France

[73] Assignee: Thomson-CSF, Paris, France

[21] Appl. No.: 543,963

[22] Filed: Oct. 20, 1983

[30] Foreign Application Priority Data

Oct. 22, 1982 [FR] France .................................. 82 17739

[51] Int. Cl.³ .............................. B01J 1/10; C08F 8/00
[52] U.S. Cl. .................................. 252/62.9; 204/159.2; 204/159.17; 204/158 HE; 264/22; 264/24; 310/311; 310/800; 361/225; 427/100; 428/421; 526/242; 526/250; 526/255

[58] Field of Search ................ 252/62.9 R; 204/159.2, 204/159.17, 158 HE; 310/311, 800; 526/242, 250, 255; 361/225; 264/22, 24; 427/100; 428/421

[56] References Cited

U.S. PATENT DOCUMENTS 4,239,608 12/1980 Pantelis .......................... 204/159.17

FOREIGN PATENT DOCUMENTS

| 48-39998 | 6/1973 | Japan | 252/62.9 R |
| 49-64666 | 6/1974 | Japan | 264/22 |
| 52-38580 | 3/1977 | Japan | 427/100 |

*Primary Examiner*—Arthur P. Demers
*Attorney, Agent, or Firm*—Cushman, Darby & Cushman

[57] ABSTRACT

The invention relates to piezoelectric or pyroelectric polymer materials. It provides a process for manufacturing these materials comprising pressing polymer pellets while heating, dipping the obtained sheets in water, stretching the sheets, electrically polarizing the sheets by applying between the two faces of the sheets an electric orientation field, irradiating the sheets to obtain crosslinking and reheating the sheets.

11 Claims, 2 Drawing Figures

PROCESS FOR MANUFACTURING A PIEZO- OR PYROELECTRIC POLYMER MATERIAL COMPRISING A CROSS-LINKING STEP

BACKGROUND OF THE INVENTION

1. Field of the Invention

The present invention relates to piezoelectric or pyroelectric polymer materials. It provides a manufacturing process comprising the cross-linking of the chains forming the polymer, which results in improving some of its piezoelectric characteristics and conferring thereon a better dimensional stability with respect to temperature variations.

2. Description of the Prior Art

Some polymers are capable of acquiring piezoelectric or pyroelectric properties when they are subjected to mechanical or electrical stresses. This is the case more especially with vinylidene polyfluoride ($PVF_2$) which is one of the most widely used. Piezoelectric properties are conferred on this material by two successive or simultaneous treatments. These treatments consist in stretching a sheet of $PVF_2$ by a factor equal at least to three, at a temperature of about 70° C., and subjecting it to an intense electric field greater than or equal to 1 MV/cm. These operations may be simultaneous as in the case of laminating with polarization. The induced deformation is as a rule irreversible, except round about the melting temperature, for it is accompanied by a spherulitic fibrillar morphological transition. However, it has been discovered that a part of this deformation is recovered by heating beyond the laminating temperature: for example, re-heating to 90° C. for one hour without applied stresses leads to a shrinkage of 7 to 8% in the stretching direction and substantially the same relative increase in thickness: volume and width (perpendicular to the stretching direction) remain constant. This re-heating gives to the polymer sheet, at temperatures which may be higher than that corresponding to the operations for acquiring its piezo- or pyroelectric properties, dimensional stability in time and a stable behavior of the piezo- or pyroelectric activity. The stability of these parameters is achieved however to the detriment of the piezoelectric activity which drops from 10 to 30%. Other disadvantages also appear. For example, the frequencies corresponding to natural vibration modes are affected, whether the sample is free (variations of dimensions) or partially clamped (variations of the internal mechanical tension state).

SUMMARY OF THE INVENTION

To overcome this disadvantage, the invention provides blocking the possible movements of the macromolecular chains of the amorphous phase before re-heating. In fact, an Xray diffusion examination at small angles shows that, in the periodic amorphous-cristallite succession along the fibers of the polymer, it is the amorphous zone which is subjected substantially as a whole to shrinkage. It is possible to block the macromolecular chains of the amorphous zone by cross-linking: the purpose of cross-linking is to establish links between these different chains and consequently to increase the rigidity of the volume concerned.

The invention provides then a process for manufacturing at least one piezoelectric or pyroelectric element from a polymer material capable of acquiring piezoelectric or pyroelectric properties, the acquisition of said properties comprising at least one step for electrically polarizing said material and further comprising a step for cross-linking the chains forming said polymer material.

BRIEF DESCRIPTION OF THE DRAWINGS

The invention will be better understood from the following description and accompanying figures in which.

DESCRIPTION OF THE PREFERRED EMBODIMENT

Figure 1:
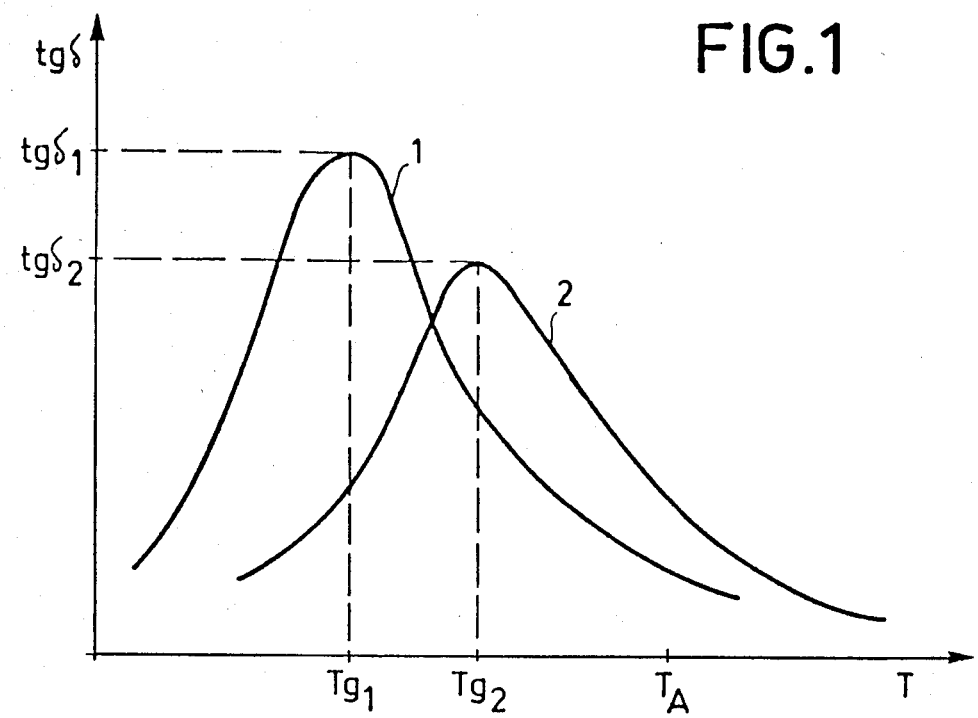
FIG. 1 is a diagram representing the dielectric losses with respect to the temperature.

There exist different methods for cross-linking an organic material. A chemical method may be used: coupling of the chains may be achieved for example by means of peroxides. Another possible method for cross-linking organic chains is high energy irradiation, for example by means of electrons. This latter method is particularly advantageous because of its ease of use. So that the principle of the invention may be well understood, it is useful to recall the main physical characteristics of piezoelectric polymers. More precisely, the case of $PVF_2$ will be described which is a typical example of a semi-crystalline polymer, but the invention applies to all piezoelectric or pyroelectric polymers. The invention applies, among others, to $PVF_2$ alloys and copolymers, to polyvinyl chloride (PVC) and to polyvinyl fluoride (PVF).

In the molten state, the $PVF_2$ polymer crystallizes on cooling in the form of spherulites whose radius varies from 0.1 micron to a few microns ($\alpha$ phase). The spherulites are formed from fibrils containing lamella directed radially from the center called nucleation center (of a thickness of 100 to 200 angströms). The lamella are formed of cristallites (assemblies of orientated and bent chains) interconnected by amorphous parts. Orderless chains connect the lamella together and the cristallites together, thus forming the intercrystalline amorphous part. At this stage, the macroscopic mechanical properties of a $PVF_2$ sheet are those of an isotropic body. The amorphous phase represents 40 to 60% of the material and corresponds to the disordered interlamellar and interspherulitic regions. At ambient temperature, since the amorphous phase is viscous, it determines to a large extent the mechanical properties of the material.

There further exists a polar $\beta$ phase which is of the greatest interest for its lends itself more readily to the development of piezoelectric properties. It is obtained mainly by mechanical phase transformation at a low temperature (about 70° C.) from the $\alpha$ phase. The mechanical transformation consists in stretching the polymer sheet which causes an irreversible deformation. The axes of the cristallites (axes of the macromolecular chains) tend to be orientated parallel to the stretching direction, giving rise to a fibrillary type morphology. The chains, initially twisted, take on a zig-zag configuration allowing the electric dipolar modes to add their effects. The acquisition of the piezoelectric properties is then obtained by applying between the two faces of the stretched $PVF_2$ sheet (stretched to 3 to 4 times its initial value) an electric orientation field of the order of 1 MV/cm.

The high energy irradition of a polymer sheet produces two main effects: rupture of the main or lateral chains whose ends are combined together again in a three-dimensional arrangement whereas it was initially of a uni-dimensional type (aligned chains) and local ionizations along the chains which create strong links therebetween. At small doses, electron cross-linking concerns essentially the amorphous phase and very little the crystalline zones. This is because there is practically no order in the amorphous phase whereas high interchain couplings exist in the crystalline zones which are ordered zones.

Blocking, by cross-linking, of the movements of the chains belonging to the amorphous zones results then in increasing the mechanical rigidity of the sample concerned. Consequently, when this sample is subjected to stabilizing re-heating, the macroscopic shrinkage following the reheating will be correspondingly reduced. Cross-linking also results in lowering the dielectric constant and the losses of the amorphous zones, and so those of the sample as a whole. In fact, since the amorphous chains are partly blocked, the same goes for the dipoles which they carry: under the electric field applied, the dipolar orientation polarization is limited, which results in a reduction of dielectric permittivity. Moreover, since the average dimension of the free chain elements is smaller than before cross-linking, the spectrum of the dielectric losses is necessarily different.

FIG. 1 is a diagram which gives the theoretical trend of the dielectric losses shown by $tg\delta$ ($\delta$ being the loss angle) as a function of the temperature T, for a $PVF_2$ sheet on which piezoelectric properties have been conferred. Curve 1 is given for a $PVF_2$ sheet not having been cross-linked. Curve 2, on the other hand, is given for the same sheet after being cross-linked by irradiation. Curves 1 and 2 have a bell-shaped trend and have been plotted for a given frequency. They present respectively maxima for the temperatures $Tg_1$ and $Tg_2$, called vitreous transition temperatures, to which losses $tg\delta_1$ and $tg\delta_2$ correspond. For each curve, at temperatures less than the vitreous transition temperature, the amorphous zones of the corresponding material are rigid. Above this temperature, these zones are viscous or fluid. For the purpose of comparison, $T_A$ represents the ambient temperature. It can be seen that, though the vitreous transition temperature Tg increases when crosslinking is carried out, on the other hand the losses $tg\delta$ decrease. There is also shifting of the curve $tg\delta = f(T)$ rightwards of the diagram. This shift causes, in some temperature zones and at certain frequencies, a reduction of the dielectric losses (but increases in others). However, the loss maximum decreases when the cross-linking rate increases. The temperature Tg increases with the frequency. This leads to optimizing the losses depending on the frequency range and the temperature range corresponding to the use.

For irradiation doses such that there is cross-linking of the amorphous zones and non destruction of the crystalline zones, it may be arranged for the remanent polarization to be little affected as well as the piezoelectric coefficients $$d_{ij} = \frac{dP_i}{dX_j}.$$

In this case, cross-linking of the amorphous alone must cause an increase of the piezoelectric coefficients $$g_{ij} = \frac{d_{ij}}{\epsilon_{33}}$$

since the permittivity $\epsilon_{33}$ must decrease more quickly than $d_{ij}$. It follows then that the voltage sensitivity of a cross-linked piezoelectric sensor must be increased. Similarly, the electromechanical coupling coefficient $$K_{3i}^2 = \frac{d_{3i}^2 \cdot E_i}{\epsilon_{33}} = g_{3i} \cdot d_{3i} \cdot E_1$$

may be expected to increase because of the increase of $g_{3i}$ and of Young's modulus $E_i$. In what has just been described, it has been assumed that the polymer sheet is defined by a plane with direction 1 and 2, the thickness of the sheet being in direction 3 and uniaxial stretching having been effected in direction 1.

The $PVF_2$ samples may be prepared in the following way. $PVF_2$ pellets are first of all pressed at 220° C. for 10 mins. The sheet obtained is then dipped in water after which lamination and simultaneous polarization at 75° C. is carried out. The stretching rate is about 4 which brings the final thickness to about 170 microns. The polarizing voltage applied is of the order of 15 kV. The sheet obtained, slightly stretched, is then heated to 80° C. for 30 minutes so as to planify it. The $PVF_2$ sheet is now ready for use.

So as to bring out the influence of cross-linking on the piezoelectric behavior of $PVF_2$, the results obtained with identical samples cut out from the above formed sheet will be compared. The samples are irradiated under an electron accelerator at different irradiation doses. The increase in dose is obtained by successive irraditions. Thus, samples irradiated at 20,40,60,80 and 100 Mrads and a non irradiated sample are obtained. The previous six samples are re-heated at 90° C. for 1 hour without application of mechanical stress. After cooling to room temperature, the following are measured:

the decrease in length $\Delta L$ parallel to the stretching direction due to the thermally induced shrinkage;

the increase in thickness $\Delta e$;

the reduction of the piezoelectric coefficient $\Delta d_{33}$.

The results of these measurements are shown in the following table in the form of relative variations in length, thickness and piezoelectric coefficient $d_{33}$ as a function of the irradiation dose (from 0 to 100 Mrads). They are compared with the voluminal fraction of the material which is insoluble at 25° C. in a solvent such as dimethyl formamide which forms a measurement of the cross-linking rate. In fact, it is the chains of the amorphous phase which are dissolved. This phase is dissolved all the better the looser the links between the chains.

| Dose (Mrads) | 0 | 20 | 40 | 60 | 80 | 100 |
| --- | --- | --- | --- | --- | --- | --- |
| Insoluble fraction | 0 | 0.2 | 0.5 | 0.7 | 0.8 | 0.85 |
| $-\frac{\Delta L}{L}$ (%) | 7 | 2.5 | 1.6 | 1.2 | 0.9 | 0.4 |
| $\frac{\Delta e}{e}$ (%) | 9.5 | 2.2 | 1.5 | 1.2 | 0.9 | 0.3 |

| Dose (Mrads) | 0 | 20 | 40 | 60 | 80 | 100 |
|---|---|---|---|---|---|---|
| $-\dfrac{\Delta d_{33}}{d_{33}}$ (%) | 13 | 6.5 | 3 | 2.4 | 2 | 1 |

Figure 2:
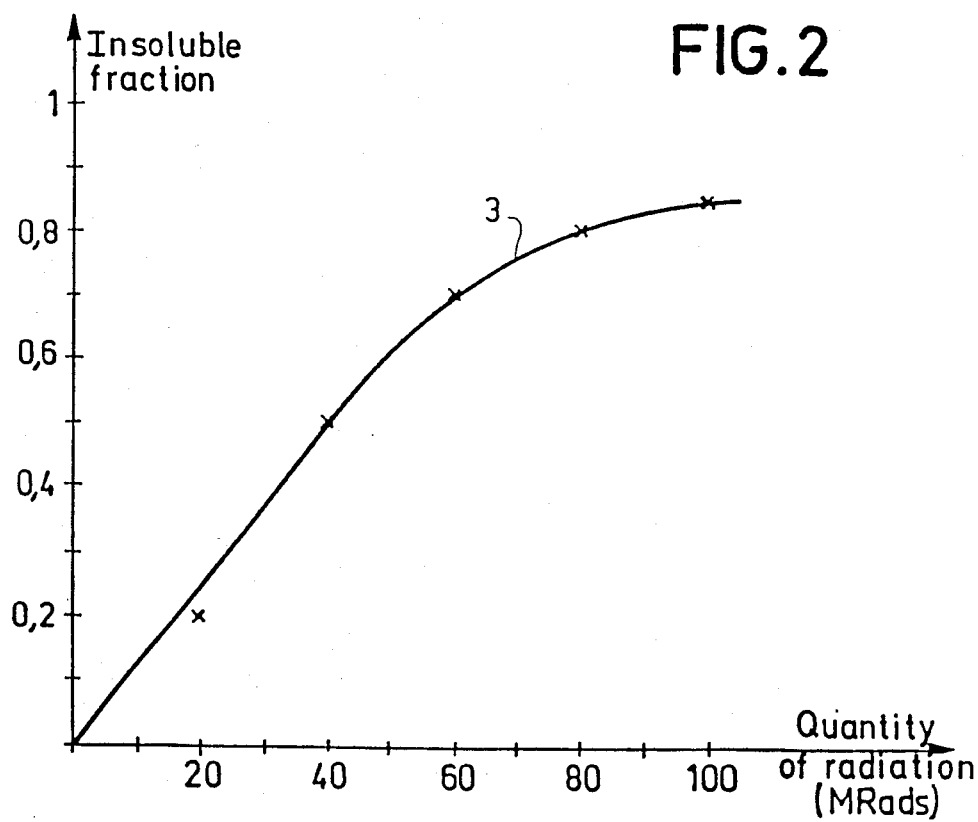
FIG. 2 is an explanatory diagram.

It can be seen from this table that a non irradiated sample is completely soluble. In fact, since the cristallites no longer have the material support of the amorphous phase, they are dispersed in the solution. When the dose of electron irradiation increases, the cross-linking rate also increases which tends to make the amorphous mass surrounding the cristallites more rigid and less soluble. FIG. 2 is a diagram which shows the voluminal fraction of the material which is insoluble as a function of the irradiation dose in Mrads (curve 3). From 0 to 60 Mrads of irradiation, curve 3 is practically linear. Above 60 Mrads, it can be seen that the irradiation has a smaller effect on cross-linking. A dose of 100 Mrads constitutes practically the saturation of the cross-linking.

Coming back to the preceding table, it will be noted that the cross-linking has a determining effect on the relative variations of length L (in the stretching direction), thickness e of the samples and the piezoelectric coefficient $d_{33}$. For 100 Mrads of irradiation, these relative variations have all been modified by at least one order of size. The essential part of these variations is obtained for a dose of 40 Mrads, i.e. for a cross-linking rate of 50%. In fact, at this level of cross-linking, re-heating causes shrinkage which is only 1.6% instead of 7% without cross-linking. Similarly, $d_{33}$ only decreases by 3% instead of by 13%.

Cross-linking also has an effect on the values of the piezoelectric coefficients of piezoelectric polymer elements not subjected to re-heating. Measurements were carried out on such samples for frequencies less than or equal to 1 kHz. In particular, $\epsilon_{33}$ and Tg were measured for 1 kHz. The following table shows the results of these measurements. As in the preceding table, the electron irradiation doses range from 0 to 100 Mrads. Depending on the irradiation dose, the piezoelectric coefficients $d_{33}$ and $d_{31}$, the dielectric constant $\epsilon_{33}$, Young's modulus $E_1$, the vitreous transition temperature Tg and the maximum dielectric losses represented by $tg\delta_{max}$ were measured. From these measurements, the coefficients $$g_{33} = \frac{d_{33}}{\epsilon_{33}} \text{ and } g_{31} = \frac{d_{31}}{\epsilon_{33}}$$

as well as the electromechanical coupling coefficients $$k_{33}^2 = \frac{d_{33}^2 \cdot E_3}{\epsilon_{33}} \text{ and } k_{31}^2 = \frac{d_{31}^2 \cdot E_1}{\epsilon_{33}}$$

considering that $E_3$ is practically equal to $E_1$, were deduced.

| Dose (Mrads) | 0 | 20 | 40 | 60 | 80 | 100 |
|---|---|---|---|---|---|---|
| $d_{33}(10^{-12} C \cdot N.^{-1})$ | 24 | 23 | 23 | 23 | 23 | 22 |
| $d_{31}(10^{-12} C \cdot N.^{-1})$ | 17 | 15.8 | 15.7 | 15.5 | 15.5 | 14.3 |
| $\epsilon_{33}(10^{-10} F/m)$ | 1.7 | 1.5 | 1.45 | 1.33 | 1.28 | 1.26 |
| $g_{33}(10^{-2} V \cdot m \cdot N^{-1})$ | 14.1 | 15.3 | 15.9 | 17.3 | 18 | 17.5 |
| $g_{31}(10^{-2} V \cdot m \cdot N^{-1})$ | 10 | 10.5 | 10.8 | 11.6 | 12.1 | 11.3 |
| $E_1(10^9 N \cdot m^{-2})$ | 3 | 3.8 | 3.6 | 3.9 | 4 | 4.1 |
| $k_{33}^2(10^{-2})$ | 1 | 1.34 | 1.32 | 1.55 | 1.66 | 1.58 |
| $k_{31}^2(10^{-2})$ | 0.51 | 0.63 | 0.61 | 0.7 | 0.75 | 0.66 |
| Tg (°C.) | −21 | −16 | −11 | −8 | −5 | −3 |
| $tg\,\delta_{max}$ | 0.15 | 0.143 | 0.132 | 0.121 | 0.12 | 0.115 |

An examination of this table shows that the coefficient $d_{33}$ and $d_{31}$ decrease more slowly than the dielectric constant $\epsilon_{33}$ with the irradiation except at the maximum dose of 100 Mrads. It follows that the coefficients $g_{33}$ and $g_{31}$ increase continuously up to the dose of 80 Mrads and then decrease. Young's modulus $E_1$ increases with the irradiation with a slight drop about 40 Mrads. It is assumed that the modulus $E_3$ has substantially the same value as $E_1$; The direction of the variations of the parameters $E_1$, $E_3$, $d_{33}$, $d_{31}$ and $\epsilon_{33}$ causes for $k_{33}^2$ and $k_{31}^2$ an increase up to an irradiation dose of 80 Mrads with a slight drop at about 40 Mrads. Above 80 Mrads, $k_{33}^2$ and $k_{31}^2$ decrease. The transition temperature Tg, measured by the temperature of the maximum of the dielectric losses $tg\delta$ at 1 kHz increases regularly whereas the dielectric losses decrease.

Measurements were made on an ultrasonic transducer operating in thickness mode resonance at 5.5 Mhz and formed from a $PVF_2$ sheet which had been re-heated. Without irradiation, the dielectric losses of the transducer represent 27%. After irradiation at 40 Mrads, the dielectric losses decrease to 19% and its natural input-output attenuation drops from 12.5 to 11 dB.

We might then conclude that the optimum irradiation dose is close to 80 Mrads: i.e. for the maximum values $g_{33}, g_{31}, k_{33}^2$ and $k_{31}^2$. However, it has been discovered that above 50 Mrads, the samples become brittle and tend to split spontaneously in the form of fibers parallel to the stretching axis. This is due to the fact that the interconnection between the chains of the amorphous zone due to cross-linking occur especially in parallel planes. Since the greatest part of the shrinkage is already obtained for the dose of 40 Mrads and since the piezoelectric properties are improved at this dose, the optimum irradiation dose is then situated close to this dose, i.e. for a cross-linking rate close to 0.5.

It comes within the scope of the invention to apply cross-linking to polymers other than $PVF_2$, in particular to the alloys including $PVF_2$ and copolymers thereof having to undergo or not reheating. This is possible since the vitreous transition temperatures are greater than or less than the ambient temperature. In all cases, the irradiation must affect the cristallites as little as possible. The cristallites seem to be impaired for $PVF_2$ beyond 80 Mrads, which might explain the drop in parameters $\epsilon_{33}$, $g_{33}$, $g_{31}$, $k_{33}^2$ and $k_{31}^2$ above 80 Mrads.

It also comes within the scope of the invention to obtain cross-linking of the chains of the amorphous zones by methods other than electron irradiation. A chemical method may be contemplated, for example by using peroxides.

The invention also applies to pyroelectric polymers. It also applies to piezoelectric or pyroelectric elements which are not needed to undergo stretching or any physical stress to obtain a polar phase. As was stated above, cross-linking also results in lowering the dielectric constant and the losses of the amorphous zones, and so these elements may be irradiated for the sole purpose of improving their piezoelectric or pyroelectric properties.

Cross-linking may also not concern the whole of the surface of the elements in question, particularly when these elements comprise folded zones where a certain flexibility is required. Similarly, assemblies may be conceived comprising elements, some of which are cross-linked and others which are not. In the example chosen, it was preferred to effect the cross-linking step after the polarizing step, but it is possible to reverse the order of these two steps.

The process of the invention is efficient in combatting shrinkage due to re-heating. It improves the piezo-electric properties. In addition, its use is inexpensive.

What is claimed is:

1. A process for manufacturing at least one piezoelectric or pyroelectric element formed from a polymer material capable of acquring piezoelectric or pyroelectric properties comprising
    pressing polymer pellets to form polymer sheets
    dipping the polymer sheets in water,
    stretching the dipped sheets,
    electrically polarizing said polymer sheets by applying between the two faces of said sheets an electric orientation field,
    irradiating said polymer sheets to obtain a cross-linking rate close to 0.5, and
    reheating said polymer sheets to form said element.

2. The manufacturing process as claimed in claim 1, wherein said stretching step takes place before or during said electric polarizing step.

3. The manufacturing process as claimed in claim 1, wherein said irradiating step takes place after said electric polarizing step.

4. The manufacturing process as claimed in claim 2, wherein said irradiating step takes place after said stretching step and before said electric polarizing step.

5. The manufacturing process as claimed in claim 1, wherein said polymer material is vinylidene polyfluoride.

6. The manufacturing process as claimed in claim 1, wherein said polymer material is an alloy including vinylidene polyfluoride.

7. The manufacturing process as claimed in claim 1, wherein said material comprises vinylidene polyfluoride copolymers.

8. The manufacturing process as claimed in claim 1, wherein said irradiating concerns only a part of said polymer material.

9. The manufacturing process as claimed in claim 1, wherein said irradiating is achieved by electron irradiation.

10. The manufacturing process as claimed in claim 1, wherein said irradiating is achieved by electron irradiation of vinylidene polyfluoride at a dose of 40 Mrads.

11. A process for manufacturing at least one piezoelectric or pyroelectric element formed from a polymer material capable of acquiring piezoelectric or pyroelectric properties comprising:
    pressing polymer pellets at about 220° C. for about 10 minutes to form polymer sheets,
    dipping the polymer sheets in water,
    stretching the dipped sheets to 4 times their initial value at about 75° C., to a thickness of about 170 microns,
    electrically polarizing said polymer sheets by applying between the two faces of said sheets an electric orientation field on the order of 15 kV,
    irradiating said polymer sheets to obtain a cross-linking rate close to 0.5, and
    reheating said polymer sheets to about 80° C. for about 30 minutes to form said element.

* * * * *